ns; Rene E. Grossman

United States Patent [19]
Baker et al.

[11] Patent Number: 5,454,906
[45] Date of Patent: Oct. 3, 1995

[54] METHOD OF PROVIDING SACRIFICIAL SPACER FOR MICRO-MECHANICAL DEVICES

[75] Inventors: James C. Baker, Coppell; Scott H. Prengle, Plano, both of Tex.

[73] Assignee: Texas Instruments Inc., Dallas, Tex.

[21] Appl. No.: 263,208

[22] Filed: Jun. 21, 1994

[51] Int. Cl.⁶ .............................. B44C 1/22; B29C 37/00
[52] U.S. Cl. .......................................... 216/66; 156/655.1
[58] Field of Search .................... 156/655, 659.1, 156/668; 359/223, 291; 437/229

[56] References Cited

U.S. PATENT DOCUMENTS 5,312,513  5/1994  Florence et al. ............... 156/656 X
5,314,572  5/1994  Core et al. ..................... 156/644 X Primary Examiner—William Powell
Attorney, Agent, or Firm—Julie L. Reed; Richard L. Donaldson; Rene E. Grossman

[57] ABSTRACT

A method of fabricating micro-mechanical devices that use support elements (13) raised from a substrate (15), to support moveable elements (11). First, support elements (13) having reflective top surfaces (31) are fabricated. A layer of photoresist material (41) is then deposited over the support elements (13), to a thickness that substantially covers their reflective top surfaces (31). The photoresist layer (41) is exposed, which results in the areas (61) over the support elements (13) being more highly exposed than the areas (62) between the support elements (13). This permits a subsequent developing step that can be controlled to the purpose of removing the photoresist between the support elements (13) to a height planar with the reflective top surfaces of the support elements, while guaranteeing that the photoresist will be removed over the support elements (13).

18 Claims, 2 Drawing Sheets

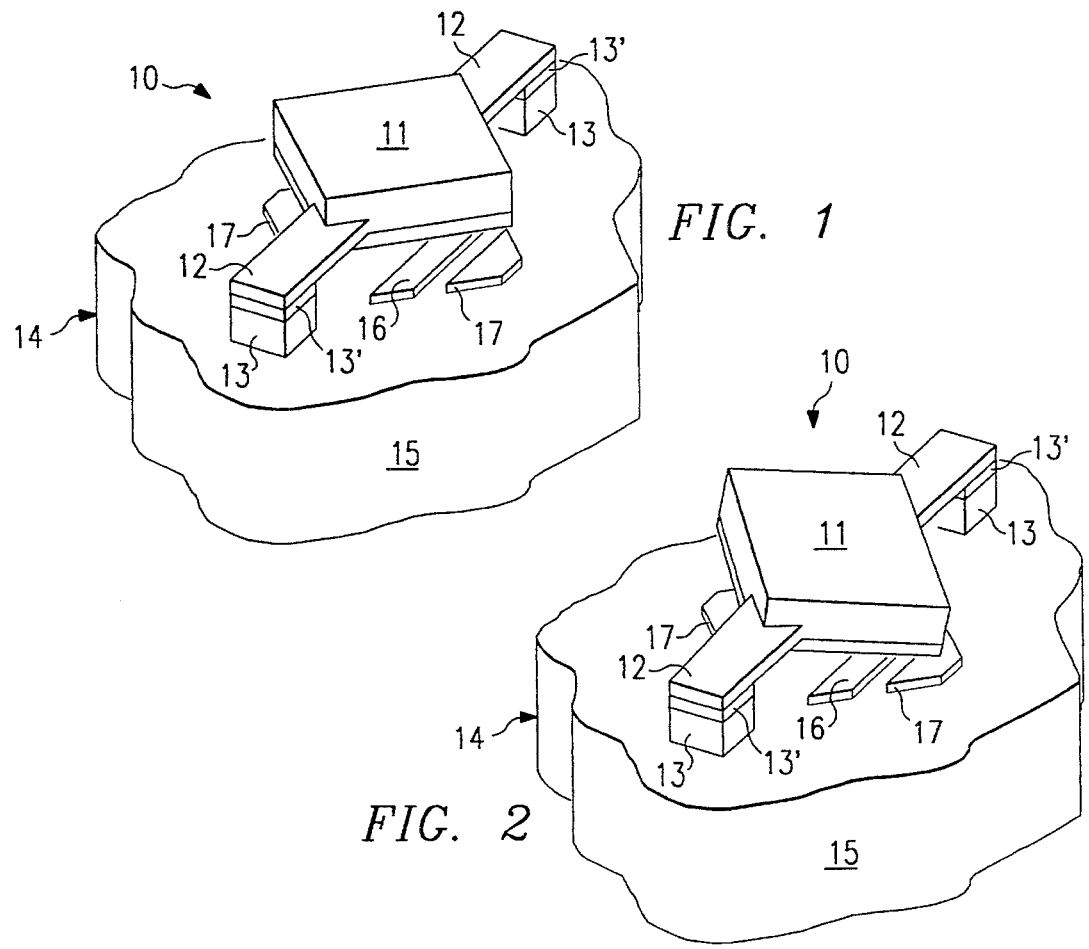
FIG. 1
FIG. 2
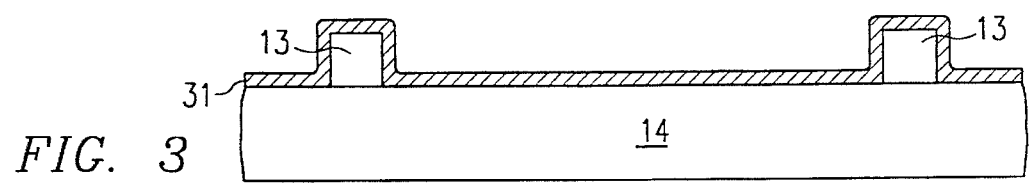
FIG. 3
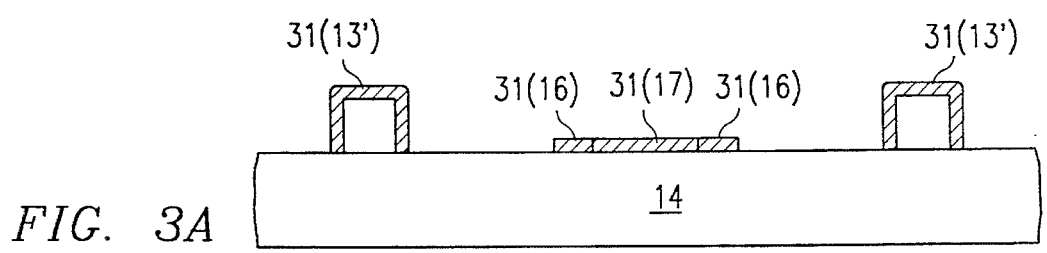
FIG. 3A
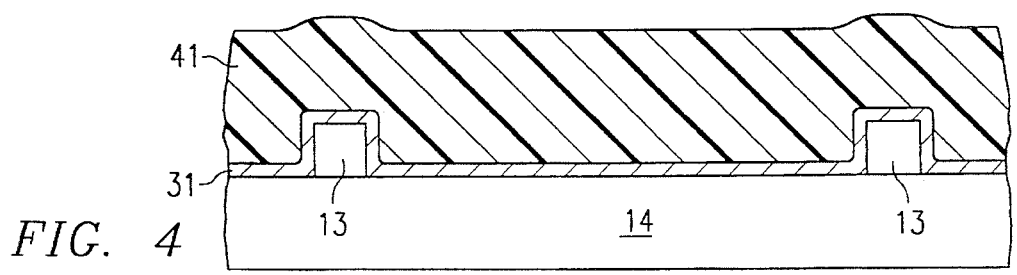
FIG. 4

METHOD OF PROVIDING SACRIFICIAL SPACER FOR MICRO-MECHANICAL DEVICES

TECHNICAL FIELD OF THE INVENTION

This invention relates to micro-mechanical devices, and more particularly, to a part of their fabrication process that involves providing sacrificial spacer material for later removal under other patterned structure.

BACKGROUND OF THE INVENTION

A recent development in the field of electro-mechanics has been the miniaturization of various mechanical devices. Typical of such devices are tiny gears, levers, and valves. These "micro-mechanical" devices are manufactured using integrated circuit techniques, often together with electrical control circuitry. Common applications include accelerometers, pressure sensors, and actuators. As another example, micro-mirrors can be configured for use in spatial light modulators.

For fabricating micro-mechanical devices, as with electrical integrated circuits, a carrier, known as a wafer, has thin-film materials selectively deposited and patterned on it. Thin-film deposition and wet and dry etching are integral parts of the fabrication process. The thin films are patterned to provide structural elements of the micro-mechanical elements. Sacrificial etching is used to provide a "spacer layer", which is a soluble layer that is grown or deposited for later removal from beneath structure that has been patterned above it. The removal is usually by wet etching. The patterned structure is left behind, with an air gap between it and its underlying structure. The air gap permits the formation of elements that move, such as by rotating, bending, or tilting.

One type of micro-mechanical spatial light modulator is a digital micro-mirror device (DMD), which has an array of tiny tilting mirrors. For freedom of movement, each of these mirrors is mounted on one or more post-supported hinges and spaced by means of an air gap, over underlying control circuitry. A typical sequence of steps for manufacturing the mirrors and their hinges is to etch the support posts, provide sacrificial spacer material between the support elements, fabricate the mirrors and hinges on the surface of the spacer material such that each hinge is in contact with its support post, and remove the sacrificial material. Many DMD designs call for the sacrificial material to be provided in a manner that provides a surface that is co-planar with the top surfaces of the support elements. In the past, this has been accomplished by at least two steps that include depositing a layer of sacrificial material over the support elements and selectively etching away the material over the support posts. Typically, the selective etching requires use of a mask.

SUMMARY OF THE INVENTION

One aspect of the invention is a method of fabricating a micro-mechanical device having at least one moveable element. At least one support element is fabricated on a substrate, extending upwardly from the substrate. The support element has a reflective top surface. A photoresist layer is deposited over the support element and on the surrounding substrate, to a thickness such that the photoresist layer covers the top of the support element. The photoresist layer is then exposed. Because of the reflective top surface of the support element, the photoresist material immediately above the reflective top surface of the support element is more highly exposed. The photoresist layer is then etched to remove it down to a height between the support elements that is substantially the same as the height of the reflective top surface of the support element. Because the area over the reflective top surfaces was more highly exposed, the removal of the photoresist material in these areas is guaranteed, and the result of the etch is a planer surface comprised of the reflective top surfaces of the support elements and the remaining photoresist material that surrounds them. The moveable element may then be fabricated on the planar surface, and the remaining photoresist subsequently removed.

A technical advantage of the invention is that it can be used to provide spacer material between support elements without damage to their physical integrity. The process is performed without masks, reticles, or the need for alignment, with the result that manufacturing throughput is increased. The surface of the sacrificial material is coplanar with the top surface of the support elements, so that subsequent fabrication of the moveable elements can be performed on a flat surface.

BRIEF DESCRIPTION OF THE DRAWINGS

FIG. 1 illustrates an undeflected beam element of one type of micro-mechanical device, a digital micro-mirror device (DMD), made in accordance with the invention.

FIG. 2 illustrates the beam element of FIG. 1 in a deflected position.

FIGS. 3, 3A and 4–9 illustrate a process of fabricating a micro-mechanical device in accordance with the invention.

DETAILED DESCRIPTION OF THE INVENTION

Figure 5:
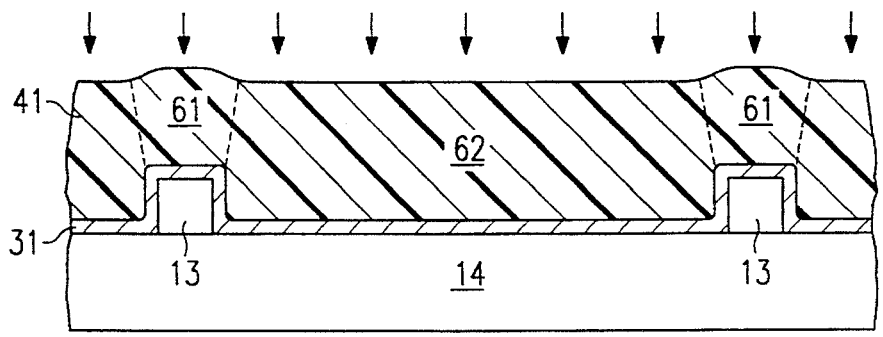

For purpose of example, the following description is in terms of a particular type of micro-mechanical device, a "digital micro-mirror device" (DMD), sometimes also referred to as a "deformable mirror device". As discussed in the Background, a DMD has one or more tiny hinged mirrors, each supported by posts raised from a substrate. The invention is used during fabrication of the DMD to provide sacrificial material between the support posts so that the mirrors can be fabricated on a flat surface.

One application of DMDs is for forming images, where the DMD has an array of hundreds or thousands of deflectable mirrors that selectively reflect light to an image plane. The images formed by the DMD can be used in display systems or for non-impact printing applications. Other applications of DMDs are possible that do not involve image formation, such as optical steering, optical switching, and accelerometers. In some of these applications, the "mirror" need not be reflective. Also, in some applications, the DMD is operated in an analog rather than digital mode. In general, the term "DMD" is used herein to include any type of micro-mechanical device having at least one hinge-mounted deflectable element that is spaced by an air gap from a substrate, relative to which it moves.

The invention is useful for other types of micro-mechanical devices that have moveable elements. Like the DMD's mirrors, other micro-mechanical devices may have tiny rotors, levers, or other moving parts that are spaced over an air gap so that they have freedom of movement.

FIGS. 1 and 2 illustrate a single mirror element 10 of a DMD. In FIG. 1, the mirror 11 is undeflected, whereas in FIG. 2, the mirror 11 is deflected by being tilted toward a landing electrode 17. As stated above, various DMD applications may use such mirror elements 10 singly or in arrays.

The mirror element 10 of FIGS. 1 and 2 is known as a "torsion beam" element. Other types of mirror elements 10 can be fabricated, including cantilever beam types and flexure beam types. Various DMD types are described in U.S. Pat. No. 4,662,746, entitled "Spatial Light Modulator and Method"; U.S. Pat. No. 4,956,610, entitled "Spatial Light Modulator"; U.S. Pat. No. 5,061,049 entitled "Spatial Light Modulator and Method"; U.S. Pat. No. 5,083,857 entitled "Multi-level Deformable Mirror Device"; and U.S. patent Ser. No. 08/097,824. Each of these patents is assigned to Texas Instruments Incorporated and each is incorporated herein by reference.

In operation for image display applications, a light source illuminates the surface of the DMD. A lens system may be used to shape the light to approximately the size of the array of mirror elements 10 and to direct this light toward them. Each mirror element 10 has a tilting mirror 11 on torsion hinges 12 attached to support posts 13. These support posts 13 are formed on and extend away from the substrate 15. The mirrors 11 are positioned over a control circuit 14, which is comprised of address and memory circuitry fabricated on the substrate 15.

Voltages based on data in the memory cells of control circuit 14 are applied to two address electrodes 16, which are located under opposing corners of mirror 11. Electrostatic forces between the mirrors 11 and their address electrodes 16 are produced by selective application of voltages to the address electrodes 16. The electrostatic force causes each mirror 11 to tilt either about +10 degrees (on) or about −10 degrees (off), thereby modulating the light incident on the surface of the DMD. Light reflected from the "on" mirrors 11 is directed to an image plane, via display optics. Light from the "off" mirrors 11 is reflected away from the image plane. The resulting pattern forms an image. The proportion of time during each image frame that a mirror 11 is "on" determines shades of grey. Color can be added by means of a color wheel or by a three-DMD setup.

In effect, the mirror 11 and its address electrodes 16 form capacitors. When appropriate voltages are applied to mirror 11 and its address electrodes 16, a resulting electrostatic force (attracting or repelling) causes the mirror 11 to tilt toward the attracting address electrode 16 or away from the repelling address electrode 16. The mirror 11 tilts until its edge contacts an underlying landing electrode 17.

Once the electrostatic force between the address electrodes 16 and the mirror 11 is removed, the energy stored in the hinge 12 provides a restoring force to return the mirror 11 to an undeflected position. Appropriate voltages may be applied to the mirror 11 or address electrodes 16 to aid in returning the mirror 11 to its undeflected position.

FIGS. 3–9 illustrate the method aspects of the invention. For purposes of example, the method of the invention is described in terms of fabricating a single mirror element 10 of a DMD of the type described above. In general, the method can be used to fabricate a DMD having an array of mirror elements 10, or to fabricate any micro-mechanical device having at least one moveable element that is fabricated over an air gap, created by removing sacrificial material.

The method may be performed on a wafer to be subsequently separated into "chips" each having an array of mirror elements 10. The process of FIGS. 3–9 is especially suited for volume production of this type, and is easily integrated into the process flow for making DMDs or other micro-mechanical devices.

In FIG. 3, a mirror element 10 of a DMD array has been partially fabricated by patterning its two support posts 13. In other types of micro-mechanical devices, instead of support posts 13 to support mirrors 11, some other type of "support element" such as continuous raised lines, could be used to support some other type of "moveable element". In general, a support element may be any shape that extends upwardly from a substrate to provide a site for supporting a moveable element of a micro-mechanical device. Thus, in the example of this description, the support element is support post 13 and the moveable element is hinged-mirror 11.

A reflective layer 31 has been deposited on support posts 13. Layer 31 may be made from any reflective material, and may be quite thin relative to other layers used for patterning structural components. Also, as explained below, reflective layer 31 need not be a continuous layer—it is sufficient for purposes of the invention that layer 31 cover the top surfaces of the support posts 13. In other devices, the support posts 13 or other support elements could be made entirely from a reflective material, which would eliminate the need for adding reflective layer 31.

FIG. 3A illustrates an optional step, in which reflective layer 31 is patterned so as to cover only the top surface and sides of support posts 13. In the case of a DMD, reflective layer 31 may be made from an electrically conductive material and also patterned to create electrodes 16 and 17. The patterning of reflective layer 31 in this manner is not essential to the invention, but as explained below in connection with FIG. 5, such patterning may be used to enhance the exposure differential between the area over support posts 13 and the area between support posts 13.

In FIG. 4, a layer 41 of photoresist material has been deposited over reflective layer 31. The deposition may be by various means, such as by being spun on. Various photosensitive materials may be used for layer 41, as used in integrated circuit manufacture. In the example of this description, the photoresist material is a positive photoresist, portions of which are removed by developers or etchants as a result of exposure to radiant energy. Layer 41 is substantially thicker than the layer used to form support posts 13, such that layer 41 extends up from substrate 15 to a height (thickness) that is greater than the combined height of support posts 13 and the reflective layer 31 over supports posts 13. A photoresist layer 41 that is approximately twice as thick as the height of support posts 13 is suitable. Generally, layer 41 is sufficiently thick to at least substantially overcome a mounding effect over support posts 13 and result in a substantially flat upper surface. However, as a result of the process explained below, to some extent, a "mounding" effect over support posts 13 after deposition of layer 41 will be self-compensating.

In FIG. 5, photoresist layer 41 is exposed. The exposure is a "flood" exposure. That is, no mask is used, and the entire surface of layer 41 is exposed. Support posts 13 act as "in-situ masks" in the sense that they cause a difference in the exposure in some areas as compared to others. More specifically, the thinner areas of layer 41 over support posts 13 will receive a higher exposure as compared to the thicker areas between support posts 13. In FIG. 5, dotted lines indicate the more highly exposed areas 61 and less highly exposed areas 62. Various factors determine the amount of differential exposure of these two areas, such as the exposure time, the reflectivity of layer 31, and the difference in thickness of layer 41 in the two areas 61 and 62. These factors are adjusted so that the differential exposure will result in an etch rate of the areas over support posts 13 that is faster than the etch rate in areas between support posts 13, by a desired etch rate increase. One consideration is that the exposure time should not saturate layer 41 in the sense that all areas become equally exposed.

Figure 6:
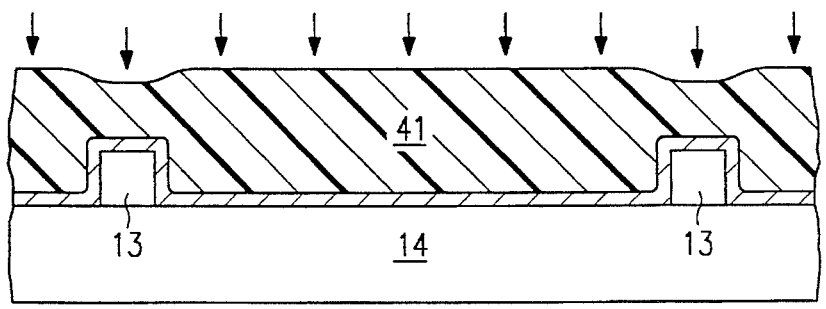
Figure 7:
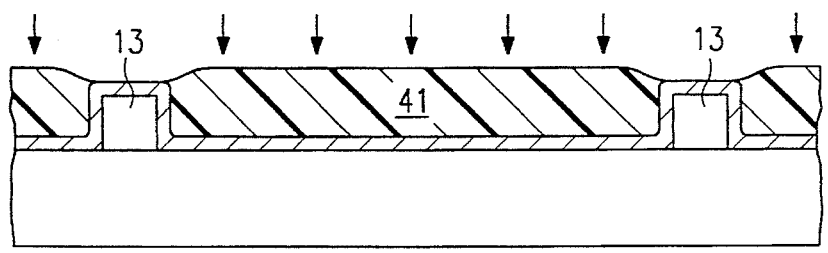

Although not illustrated, a baking step may be performed after the exposure step of FIG. 5, and prior to the etching steps of FIGS. 6 and 7. The object of this baking step is to provide a layer 41 whose etching is more easily predicted and controlled.

In FIGS. 6 and 7, the photoresist layer 41 is being developed, which is achieved by a wet etch of layer 41. As indicated, the more exposed areas 61 of layer 41 are removed at a faster rate than the less exposed areas 62.

Figure 8:
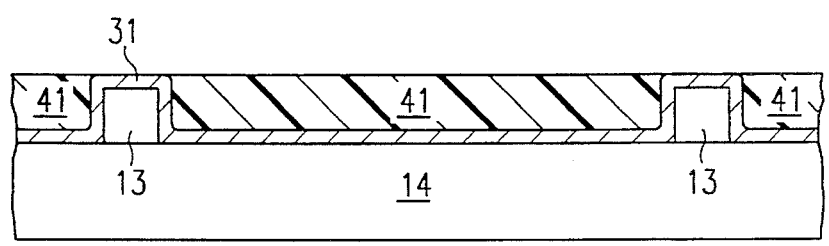

In FIG. 8, the etching of layer 41 is complete. The timing of the etch has been controlled so that the less exposed areas 62 are removed to a height that is the same as the combined height of support posts 13 and reflective layer 31. An advantage of the invention is that the because of their higher exposure, removal of the more exposed areas 61 occurs at a faster rate than removal of the less exposed areas 62. Thus, when areas 62 are etched down to a height that is equal to the combined height of support posts 13 and reflective layer 31, removal of areas 61 is certain to have occurred.

After the etch of layer 41 is completed, the wafer is baked to so that the remaining photoresist material of layer 41 will withstand subsequent fabrication steps. This remaining photoresist material acts as a "spacer" between support posts 13. The top surface of the spacer is coplanar with the reflective top surface of support posts 13.

Figure 9:
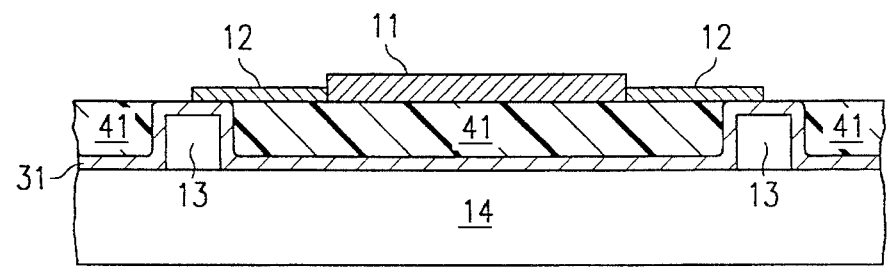

In FIG. 9, a layer of material that forms mirror 11 and hinges 12 has been deposited and patterned. In the case of other micro-mechanical devices, then various moveable elements are fabricated over this layer by depositing the material for these elements and etching them to their desired shape. The DMD patents listed above in connection with FIGS. 1 and 2 provide further details of how the mirrors and hinges are fabricated for a variety of different types of DMDs.

OTHER EMBODIMENTS

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of fabricating a micro-mechanical device having a moveable element which is movably supported by a support element, the support element being on, and having a free end spaced away from, a substrate, comprising the steps of:

rendering the free end of the support element radiant energy-reflective;

depositing a photoresist layer on the substrate to an initial thickness sufficient to cover the free end of the support element;

flood exposing the free surface of said photoresist layer to radiant energy without the use of a mask;

developing the photoresist to produce a substantially planar, continuous element-supportive surface which includes the free end of the support element and the free surface of the remaining, reduced-in-thickness photoresist;

fabricating the moveable element from materials deposited on the element-supportive surface; and removing the remaining photoresist.

2. The method of claim 1, wherein at least one of the deposited materials is in contact with the free end of the support element.

3. The method of claim 1, wherein the exposing time relative to the initial thickness of the photoresist layer is less than that required to saturate the photoresist layer.

4. The method of claim 1, wherein the photoresist between the free surface thereof and the free end of the support element is more highly exposed to the radiant energy than the initial thickness of the photoresist so that developing removes the photoresist overlying the free end of the support element at a faster rate than the photoresist overlying the substrate.

5. A method of fabricating a micro-mechanical device having at least one moveable element, using a maskless sacrificial spacer, comprising the steps of:

fabricating on a substrate, at least one support element for supporting said moveable element, said support element extending upwardly from said substrate and having a reflective top surface;

depositing a photoresist layer over said support element and on the surrounding substrate, said photoresist layer having a thickness that is greater than the distance between said reflective top surface and said substrate such that it covers said reflective top surface of said support element;

exposing said photoresist layer with a substantially uniform exposure;

developing said photoresist layer such said photoresist layer is removed down to a height that is substantially the same as the height of said reflective top surface of said support element, thereby forming a substantially planar surface comprised of said reflective top surface of said support element and of the top surface of the remaining photoresist material on said surrounding substrate;

fabricating said moveable element on said planar surface; and removing said remaining photoresist material after said moveable element has been fabricated.

6. The method of claim 5, wherein said step of fabricating at least one support element is partly performed by depositing a substantially conformal layer of reflective material over said support element and the substrate surrounding said support element.

7. The method of claim 5, wherein said step of fabricating at least one support element is performed by fabricating said support element from a reflective material.

8. The method of claim 5, wherein said step of depositing a photoresist layer is performed by depositing said layer to a thickness of approximately twice the height of said at least one support element.

9. The method of claim 5, further comprising the step of baking said photoresist layer before said developing step.

10. The method of claim 5, further comprising the step of baking said photoresist layer after said developing step.

11. The method of claim 5, wherein said exposing step is performed for a time less than the saturation time of said photoresist layer.

12. The method of claim 5, wherein said micro-mechanical device has an array of micro-mechanical elements, each having at least one support element and at least one moveable element, and wherein said developing step results in spacer areas, comprised of said remaining photoresist material, between said support elements.

13. A method of manufacturing a digital micro-mirror device having at least one deflectable mirror element, comprising the steps of:

fabricating on a substrate, at least one support post for supporting said mirror element, said support post extending upwardly from said substrate and having a reflective top surface;

depositing a photoresist layer over said support post and on the surrounding substrate, said photoresist layer having a thickness such that it covers said reflective top surface of said support post;

exposing said photoresist layer;

developing said photoresist layer such that said photoresist layer is removed down to a height that is substantially the same as the height of said support post, thereby forming a substantially planar surface comprised of said reflective top surface of said support post and of the top surface of the remaining photoresist material on said surrounding substrate;

fabricating said deflectable mirror element on said planar surface; and removing said remaining photoresist material after said deflectable mirror element has been fabricated.

14. The method of claim 13, wherein said step of fabricating at least one support post is performed by depositing a substantially conformal layer of reflective material over said support post and the substrate surrounding said support post.

15. The method of claim 13, wherein said step of fabricating at least one support post is performed by fabricating said support post from a reflective material.

16. The method of claim 13, wherein said step of depositing a photoresist layer is performed by depositing said layer to a thickness of approximately twice the height of said support post.

17. The method of claim 13, further comprising the step of baking said photoresist layer before said developing step.

18. The method of claim 13, further comprising the step of baking said photoresist layer after said developing step.

* * * * *